United States Patent
Ibone et al.

(10) Patent No.: US 10,871,512 B2
(45) Date of Patent: Dec. 22, 2020

(54) METHOD AND SYSTEM FOR DETECTING NOISE IN AN ELECTRICAL GRID

(71) Applicant: FUNDACIÓN TECNALIA RESEARCH & INNOVATION, Derio-Bizkaia (ES)

(72) Inventors: García-borreguero Melero Ibone, Derio (ES); López Arantzamendi Beñat, Derio (ES); Castro Rentería Marta, Derio (ES); Arechalde Ugarteche Ibon, Derio (ES)

(73) Assignee: FUNDACIÓN TECNALIA RESEARCH & INNOVATION, Derio-Bizkaia (ES)

( * ) Notice: Subject to any disclaimer, the term of this patent is extended or adjusted under 35 U.S.C. 154(b) by 110 days.

(21) Appl. No.: 16/300,055

(22) PCT Filed: Apr. 24, 2017

(86) PCT No.: PCT/EP2017/059681
§ 371 (c)(1),
(2) Date: Nov. 8, 2018

(87) PCT Pub. No.: WO2017/194298
PCT Pub. Date: Nov. 16, 2017

(65) Prior Publication Data
US 2019/0154749 A1   May 23, 2019

(30) Foreign Application Priority Data

May 9, 2016 (EP) ..................... 16382206

(51) Int. Cl.
*G01R 31/08* (2020.01)
*H04B 3/54* (2006.01)

(52) U.S. Cl.
CPC ............. *G01R 31/086* (2013.01); *H04B 3/54* (2013.01); *H04B 2203/5425* (2013.01)

(58) Field of Classification Search
CPC .... H04B 2203/5466; H04B 2203/5433; H04B 2203/5425; H04B 3/46; H04B 3/00;
(Continued)

(56) References Cited

U.S. PATENT DOCUMENTS 7,468,657 B2 * 12/2008 Yaney .................. H04B 1/1027
340/12.37
7,654,064 B2 * 2/2010 Riccardi ............... B65B 43/267
53/284.7

(Continued)

OTHER PUBLICATIONS

International Search Report dated Aug. 22, 2017 re: Application No. PCT/EP2017/059681, pp. 1-3, citing: US 2014/278162 A1, US 2008/055067 A1, US 2007/179721 A1.
(Continued)

*Primary Examiner* — Vinh P Nguyen
(74) *Attorney, Agent, or Firm* — Cantor Colburn LLP

(57) ABSTRACT

A method and system for detecting a source of noise in an electrical grid distributing network implementing Power Line Communications, the method including, at each meter, disposing an element behaving as a resistive element within the frequency band of the PLC, and behaving as a nonresistive element at the frequency of the electrical grid, between a first cable belonging to the distributing network and a second cable belonging to the enduser network; measuring the difference in electric potential between the two ends of each element disposed between the first cable belonging to the distributing network and the second cable belonging to the enduser network; and from the one measurement, determining whether a device belonging to the enduser network and connected to the meter is causing a noise disturbance or not.

15 Claims, 6 Drawing Sheets

(58) Field of Classification Search
CPC .......... H04B 15/005; H04B 3/32; H04B 3/54; H04B 2203/5416; H04B 2203/5495; H04B 1/50; H04B 1/7097; G01R 29/18; G01R 1/30; G01R 27/28; G01R 29/0842; G01R 31/002; G01R 31/086; G01R 31/50; G06F 11/08

See application file for complete search history.

(56) References Cited

U.S. PATENT DOCUMENTS

| | | | |
|---|---|---|---|
| 7,729,810 B2 * | 6/2010 | Bell | H02J 3/00 700/286 |
| 7,982,596 B2 * | 7/2011 | Curt | H04B 3/542 340/12.32 |
| 2007/0179721 A1 | 8/2007 | Yaney et al. | |
| 2008/0055067 A1 | 3/2008 | Curt et al. | |
| 2012/0166004 A1 | 6/2012 | Park et al. | |
| 2014/0278162 A1 | 9/2014 | Riley, Jr. | |

OTHER PUBLICATIONS

Written Opinion dated Aug. 22, 2017 re: Application No. PCT/EP2017/059681, pp. 1-6, citing: US 2014/278162 A1, US 2008/055067 A1, US 2007/179721 A1.

* cited by examiner

METHOD AND SYSTEM FOR DETECTING NOISE IN AN ELECTRICAL GRID

TECHNICAL FIELD

The present disclosure relates to the field of energy supply. More precisely, it relates to methods and systems for detecting and monitoring communication faults in devices using PLC communications.

BACKGROUND

FIG. 1 illustrates an architecture of the electrical grid. Electricity is generated in central stations 11 and distributed energy resources that produce electrical power. Electrical power from central stations is transported through transformer stations 12, transmission lines 13 and substations 15. Then the electrical power is distributed through secondary substations 16 to arrive at final consumers 17. The electrical power from distributed energy resources can be delivered to the electrical network or can be spent by the own consumer.

The electrical network (electrical grid) is suffering a process of modernization in order to implement the so-called Advanced Metering Infrastructure (AMI) which, unlike traditional Automatic Meter Reading (AMR), enables two-way communications between the control center and an intelligent measuring apparatus (also called smart meter) assigned to each electric supply point. A smart meter is usually an electronic device that records consumption or generation of electric energy in short intervals (for example every hour or even more frequently) and communicates that information to the control center for monitoring and billing. Each end-point user (end-point subscriber) has its own smart meter.

In other words, the AMI system is oriented mainly to the billing and control of the consumption or generation of the final users. As a matter of example, U.S. patent application US2012/0166004A1 discloses an energy management system comprising a power management apparatus for managing power consumption. It can, however, be also used for multiple high value applications for distribution companies (utilities) and retailers, who can offer new services thanks to the powerful specifications of the smart meters and thanks to the two-way communication between each smart meter and the control center. For example, U.S. patent application US2014/0278162A1 refers to a method for detecting and locating power outages via low voltage grid mapping.

Power Line Communications (PLC) are used in several countries for the communication between the smart meter and the control center. Usually a Data Concentrator Unit (DCU) is used in a secondary substation to collect the data related to dozens or hundreds of smart electrical meters. PLC uses the power-supply system, already installed, without having to deploy dedicated cables or use the radio spectrum. As power lines go through floors and walls in buildings, it is in principle possible to achieve communications over them. Several technologies have been developed in this sense during the last years to be used with the AMI system.

However, the electricity distribution network is complex and electrical noisy environments may cause various forms of interference in PLC technologies, resulting in unstable communications. Interference-inducing factors include, among others: a) Huge load-impedance variations: Load-impedance changes affect PLC signal voltages coupled onto the power lines, which directly impacts on the transmission distance. Changes in power factor and location of power loads dynamically change load impedances over time; b) Attenuation on selective PLC carrier frequencies: The random switching of electrical devices on a power distribution network may lead to changes in power parameters, resulting in attenuation on PLC signals on selective frequencies. At the same location and instant, this impact may vary across different PLC carrier frequencies. When certain frequencies are unsuitable for PLC, changing to different frequencies for communication might yield better results; c) Strong noise interference: Electrical equipment on the power grid, such as switched-mode power supplies and inverters, can produce significant amounts of interference on multiple frequencies that vary randomly. In the electrical network, these factors are combined and continuously changing.

Due to the interferences produced by these factors, smart meters cannot communicate as desirable, that is to say, in a continuous way in time. When communication fails, the services associated to the smart meters cannot be provided. Besides, the detection of the source of the noise causing the failure is extremely complicated, because, as hundreds of meters are interconnected, the noise is coupled to all the meters within a certain distance from the meter originating the failure.

FIG. 2 shows a conventional smart meter 1. Like traditional meters, a smart meter is connected to 4 pairs of cables or wires, each pair being identified in the figure with a letter: letters R, S and T refer each to the pair of cables or wires for each of the three phases of a three-phase electric power system, while letter N refers to the pair of neutral cables or wires (usually connected to ground). In each pair of cables R, S, T, N, the cable on the left represents the connection to the distribution network (referred to as $R_A$, $S_A$, $T_A$, $N_A$) and the cable on the right represents the connection to the home (end user network) (referred to as $R_B$, $S_B$, $T_B$, $N_B$). Smarts meters are usually installed in the entrance of a home.

Noise in the electrical network is any signal that is not the proper power signal (usually DC or 50 or 60 Hz, although other frequencies may be used instead) or the communications signal (PLC communications carrier). Noise may be started in any installation, either a load (consuming device) or a generator. When noise is generated in an installation of an end user network (in a load or in a generator of an end user network), it is instantaneously transmitted through the closest smart meters along the electrical grid. As the meter is connected to a common bus bar, it is instantaneously transmitted to the rest of the meters connected to the same bus bar. When the noise is out of the PLC frequency bands, the communication is not affected. However, when the noise is in the PLC frequency bands, the communication is disturbed and it can sometimes be totally lost. Typical PLC frequency bands may vary from one country to another. For example, in Europe PLC carriers vary from 30 kHz up to 500 kHz, depending on the country. What is more, new frequency bands may be assigned in the future and/or current ones may not be used any more. Noise affects mainly the phase to which the device (load or generator) causing the noise noise-generator" is connected (R, S or T). It is remarked that most of the loads (consuming devices) are connected to one of the three phases of the power signal). Conventional measuring devices and methods are capable of measuring the noise between the affected phase wire (R, S or T in FIG. 2) and the neutral wire (N in FIG. 2). Conventional measurements are usually performed in a smart meter between a phase (R, S, T) cable or wire and the neutral (N) cable or wire, thus measuring an instantaneous voltage. Between those points (a phase cable and a neutral cable) the measured signal can be seen with a voltage level in the same order of magnitude as the communication signal level.

Besides, when the noise is started in a certain end user network, it not only affects its meter (the meter of the end user in which network noise has been started), but it is also transmitted to other meters. Noise can be transmitted to other meters for many different reasons. In general, it can be stated that noise is transmitted to a second meter if the signal attenuation between the meter of the end user in which network noise has been started and the second meter is low enough. Noise can therefore be measured in many meters within a certain area. Because the noise is measured with similar levels in this area, it is very difficult to detect the source of the noise. This is a big problem for electric power providers because they cannot detect the origin of noise by simply measuring; on the contrary, they need to switch off the meters to detect the problem: When a meter is switched off, the electric power service to the associated end user network is interrupted. Therefore, if an end user network has a device (load or generator) causing noise, switching off its meter implies that the device does not cause noise any more. Thus, other meters within the distributing network can work properly, without being affected by the device causing disturbance. However, this requires to switch off, one by one, all the meters within a certain area, until the problematic one (noisy one) is isolated. This causes annoyance to the users and waste of time and money to the electric power providers.

Therefore, there is a need for developing a new method and system for detecting and measuring noise sources at the end-user side of the electric power network.

BRIEF SUMMARY

The disclosure provides a new method for detecting a noise source at the end-user side of the electric power network. In particular, the method permits to identify the exact source of noise (the precise home or end user at which the noise has been originated).

Although in each of the four pairs of cables or wires R, S, T, N in FIG. 2, the cable on the left or connection to the distributing network (for example, $R_A$) is considered, from the electrical point of view, to be the same electrical point as the cable on the right or connection to the end-user network (for example, $R_B$), smarts meters are usually designed to have an element in between these two points A-B (in each phase) that creates a small impedance. Examples of such an element are an internal switch in each phase (R, S, T) for disconnecting the power supply if required, or other elements. In general, the element can be any element behaving as a resistive element within the frequency band of the PLC communications (for example, currently in Europe between 30 kHz and 500 kHz), and behaving as a non-resistive element in power supply frequency (usually DC or 50 Hz or 60 Hz, although other frequencies may be used instead). The element is disposed in each phase (R, S, T), between the cable belonging to the distributing network and the cable belonging to the end-user network. Optionally, in addition to an element in each phase (R, S, T), there may be a similar element in the neutral cable. Although the difference of the voltage at the ends of this element is null in power supply frequency (DC or 50 Hz or 60 Hz or other frequencies, depending on the country), at the frequencies of the PLC communications there is an electrical difference representing the noise causing the disturbance.

In a first aspect of the disclosure, it is provided a method for detecting a source of noise in an electrical grid distributing network implementing Power Line Communications (PLC), said electrical grid distributing network comprising a plurality of meters respectively connected to a plurality of end-user networks, wherein said source of noise to be detected is originated in a device belonging to one of said end-user networks, wherein each of said meters is connected to at least one pair of cables corresponding to at least one phase of the 3 phases of the electrical grid (R, S, T), said at least one pair of cables comprising a first cable belonging to said distributing network and a second cable belonging to a corresponding end-user network. The method comprises: at each of said meters, disposing an element behaving as a resistive element within the frequency band of the PLC, and behaving as a non-resistive element at the frequency of the electrical grid, between said first cable belonging to the distributing network and said second cable belonging to the end-user network; measuring the difference in electric potential between the two ends of each element disposed between said first cable belonging to the distributing network and said second cable belonging to the end-user network; from said at least one measurement, determining whether a device belonging to the end-user network and connected to said meter is causing a noise disturbance or not.

In a particular embodiment, the method further comprises: at each of said meters, disposing another element behaving as a resistive element within the frequency band of the PLC, and behaving as a non-resistive element at the frequency of the electrical grid, between the neutral cable belonging to the distributing network and the neutral cable belonging to the end-user network; measuring the difference in electric potential between the two ends of said element; from said measurement, determining whether a device belonging to the end-user network and connected to said meter is causing a noise disturbance or not.

In a preferred embodiment, the element is a switch configured to disconnect the power supply if required. Alternatively, the element may be a cable, a splice, a resistor and a fuse, or any element behaving as a resistive element within the frequency band of the PLC, and behaving as a non-resistive element at the frequency of the electrical grid.

In a particular embodiment, the at least one measurement in the difference in electric potential between the two ends of said element is performed within said meter. In this case, the measurement is performed within said meter by means of a spectrum analyzer disposed within the meter and configured to measure the spectral response at the frequency of the PLC network between the two ends of said element.

In an alternative embodiment, the measurement in the difference in electric potential between the two ends of said element is performed at a measuring device outside said meter. In this case, the measurement is performed by means of a measuring device external to said meter. The measuring device may comprise a spectrum analyzer configured to measure the spectral response at the frequency of the PLC network between the two ends of said element, shielded cables and an isolation probe. In a particular implementation, the measuring device is comprised within a terminal cover configured to cover said meter.

In another aspect of the disclosure, it is provided a system for detecting a source of noise in an electrical grid distributing network implementing Power Line Communications (PLC), said electrical grid comprising a plurality of meters respectively connected to a plurality of end-user networks, wherein said source of noise to be detected is originated in a device belonging to one of said end-user networks, wherein each of said meters is connected to at least one pair of cables corresponding to at least one phase of the 3 phases of the electrical grid (R, S, T), said at least one pair of cables comprising a first cable belonging to said distributing network and a second cable belonging to a corresponding end-user network. Each of said meters comprises an element behaving as a resistive element within the frequency band of the PLC, and behaving as a non-resistive element at the frequency of the electrical grid, said element being disposed between said first cable belonging to the distributing network and said second cable belonging to the end-user network. The system comprises means for measuring, at each meter, the difference in electric potential between the two ends of each element disposed between said first cable belonging to the distributing network and said second cable belonging to the end-user network and for determining, from said at least one measurement, whether a device belonging to the end-user network and connected to said meter is causing a noise disturbance or not.

In a particular embodiment, said means for measuring comprises a spectrum analyzer configured to measure the spectral response at the frequency of the PLC network between the two ends of said element. In a particular implementation, the means for measuring is comprised within said meter. Alternatively, said means for measuring is external to said meter. In this case, the means for measuring further comprises shielded cables and an isolation probe. More particularly, the means for measuring is comprised within a terminal cover configured to cover said meter.

Additional advantages and features of the disclosure will become apparent from the detail description that follows and will be particularly pointed out in the appended claims.

BRIEF DESCRIPTION OF THE DRAWINGS

To complete the description and in order to provide for a better understanding of the disclosure, a set of drawings is provided. Said drawings form an integral part of the description and illustrate an embodiment of the disclosure, which should not be interpreted as restricting the scope of the disclosure, but just as an example of how the disclosure can be carried out. The drawings comprise the following figures.

DETAILED DESCRIPTION

In this text, the term "comprises" and its derivations (such as "comprising", etc.) should not be understood in an excluding sense, that is, these terms should not be interpreted as excluding the possibility that what is described and defined may include further elements, steps, etc.

In the context of the present disclosure, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The following description is not to be taken in a limiting sense but is given solely for the purpose of describing the broad principles of the disclosure. Next embodiments of the disclosure will be described by way of example, with reference to the above-mentioned drawings showing apparatuses and results according to the disclosure.

The inventive method may be implemented either within a conventional smart meter, for example, but not in a limiting way, the one illustrated in FIG. 2, or outside a smart meter, by means of an additional measuring device, as will be described next.

Figure 1:
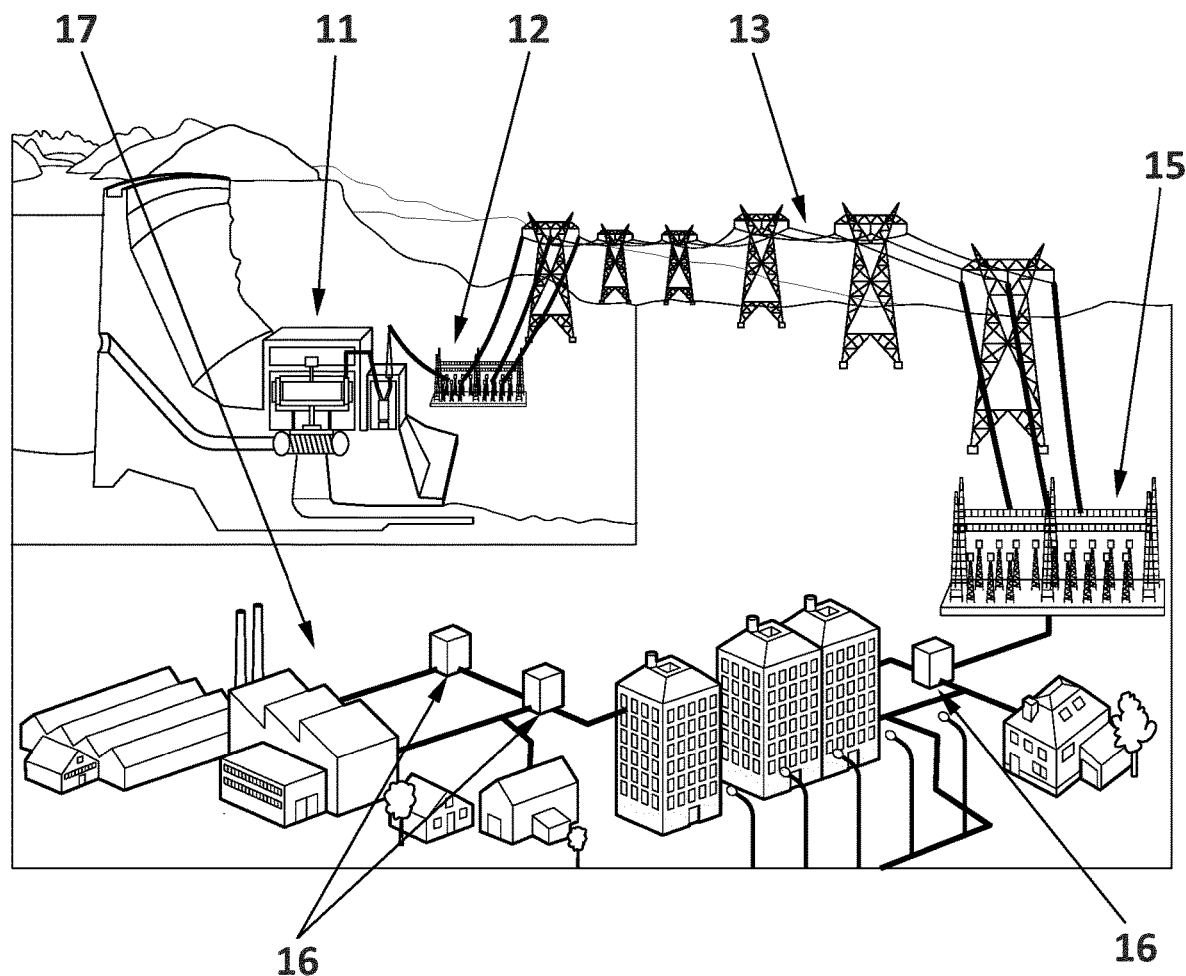
FIG. 1 illustrates a conventional architecture of the electrical grid.
Figure 2:
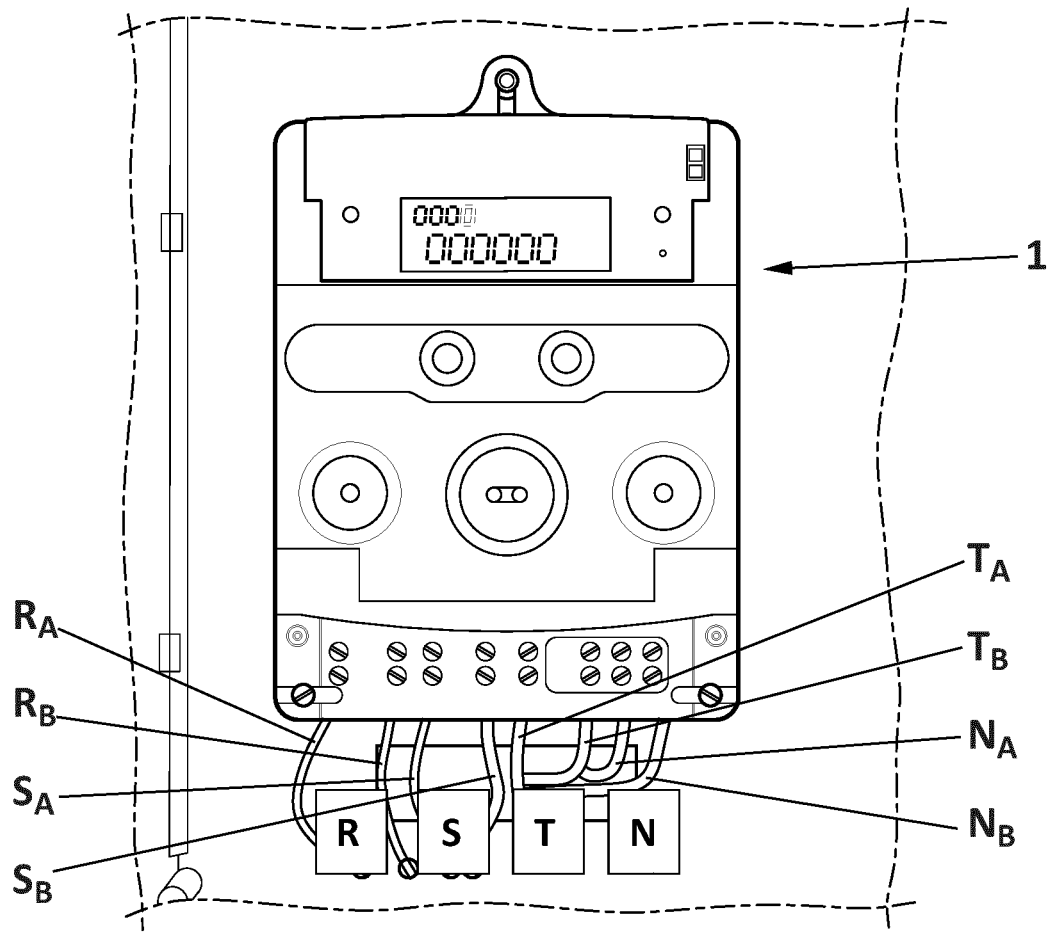
FIG. 2 shows a scheme of a conventional smart meter for monitoring the electric power network.
Figure 3:
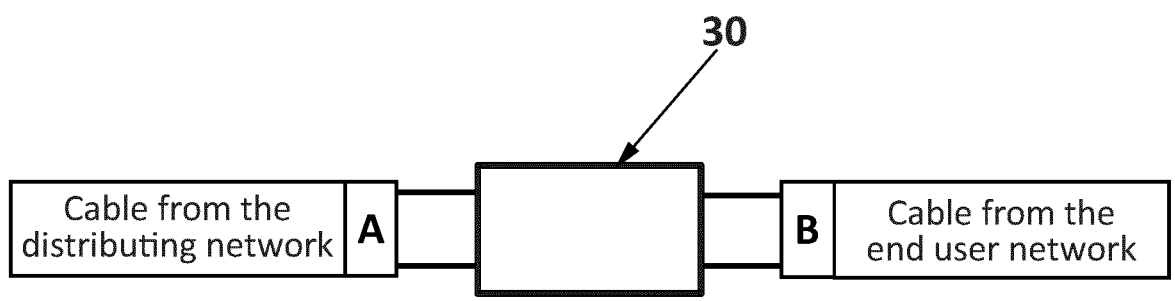
FIG. 3 shows a scheme of an internal portion of a smart meter, according to an embodiment of the disclosure. The illustrated portion includes an element behaving as a resistive element within the frequency band of the PLC communications, and behaving as a non-resistive element in power supply frequency. The element is disposed in each phase (R, S, T), between the cable belonging to the distributing network and the cable belonging to the end-user network.

As already mentioned, FIG. 2 represents a scheme of a smart meter for monitoring the electric power network according to a possible implementation of the disclosure. Although in each of the four pairs of cables or wires R, S, T, N, the cable on the left or connection to the distributing network (for example, $R_A$) is considered, for the electrical point of view, to be the same electrical point as the cable on the right or connection to the end-user network (for example, $R_B$), smarts meters are usually designed to have an element behaving as a resistive element within the frequency band of the PLC communications, and behaving as a non-resistive element in power supply frequencies, disposed in each phase (R, S, T), between the cable belonging to the distributing network ($R_A$, $S_A$, $T_A$) and the cable belonging to the end-user network ($R_B$, $S_B$, $T_B$). That is to say, in smart meters like the one exemplified in FIG. 2, there are usually three elements, one per phase (R, S, T). This element can be used for disconnecting the power supply if required. Optionally, a similar element may be located in the neutral cable, between the cable belonging to the distributing network ($N_A$) and the cable belonging to the end-user network ($N_B$). FIG. 3 illustrates this element 30 disposed within the smart meter, between the cable R, S, T or N belonging to the distributing network and the respective cable R, S, T or N belonging to the end-user network. It is remarked that other embodiments of the disclosure may encompass smart meters having only one phase (normally R) or only two phases (normally R and S), instead of three phases (R, S and T) like the one in FIG.

2. A skilled reader will understand that, when the smart meter has only one phase (R), the non-resistive element in power supply frequencies is disposed between the cable belonging to the distributing network ($R_A$) and the cable belonging to the end-user network ($R_B$). And when the smart meter has only two phases (R, S), there is one non-resistive element in power supply frequencies between the cable belonging to the distributing network ($R_A$) and the cable belonging to the end-user network ($R_B$) of the first phase (R) and there is another non-resistive element in power supply frequencies between the cable belonging to the distributing network ($S_A$) and the cable belonging to the end-user network ($S_B$) of the second phase (S).

Figure 4:
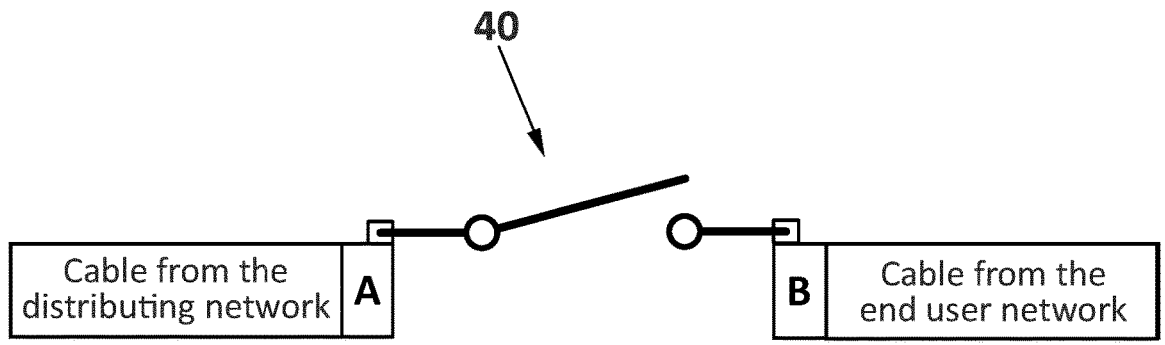
FIG. 4 shows a particular example of the element illustrated in FIG. 3.

In particular embodiments, this element is an internal switch 40 disposed in one phase (R), two phases (R, S) or the three phases (R, S, T), between the cable belonging to the distributing network ($R_A$, $S_A$, $T_A$) and the cable belonging to the end-user network ($R_B$, $S_B$, $T_B$), for disconnecting the power supply if required. This is shown in FIG. 4. Optionally, a similar switch may be located in the neutral cable, between the cable belonging to the distributing network ($N_A$) and the cable belonging to the end-user network ($N_B$). Alternative implementations of element 30 40 are a cable, a splice, a resistor and a fuse, among others. In general, this element can be represented as an impedance 30. Other elements that represent small impedances may be installed also between those two points (A, B in FIGS. 3 and 4).

When the switches 40 or, in general, those small impedances 30 (one per phase in the smart meter shown in FIG. 2 and optionally, another one in the neutral wire, or one small impedance in the only phase (R) if the smart meter has only one phase (R) or two small impedances in respective two phases (R, S) if the smart meter has only two phases (R, S)) are on (connected), the cables from the distributing network ($R_A$, $S_A$, $T_A$, $N_A$ in FIG. 2) and the cables from the house or end user network ($R_B$, $S_B$, $T_B$, $N_A$ in FIG. 2) are, in theory, the same electrical point at the frequency (usually DC and 50 or 60 Hz although other frequencies may be used instead) in the power supply. However, the inventors have observed that the cables from the distributing network ($R_A$, $S_A$, $T_A$, $N_A$ in FIG. 2) and the cables from the house or end user network ($R_B$, $S_B$, $T_B$, $N_B$ in FIG. 2) can be different electrical points in the frequency bands used for the communication (PLC carriers which, for example in Europe, vary from 30 kHz up to 500 kHz, depending on the country). In other words, if the smart meter is connected to an end user network having a device (load or generator) causing noise, then the cables from the distributing network ($R_A$, $S_A$, $T_A$, $N_A$ in FIG. 2) and the cables from the house or end user network ($R_B$, $S_B$, $T_B$, $N_B$ in FIG. 2) actually are respectively different electrical points in the frequency bands used for the PLC communication.

Figure 8:
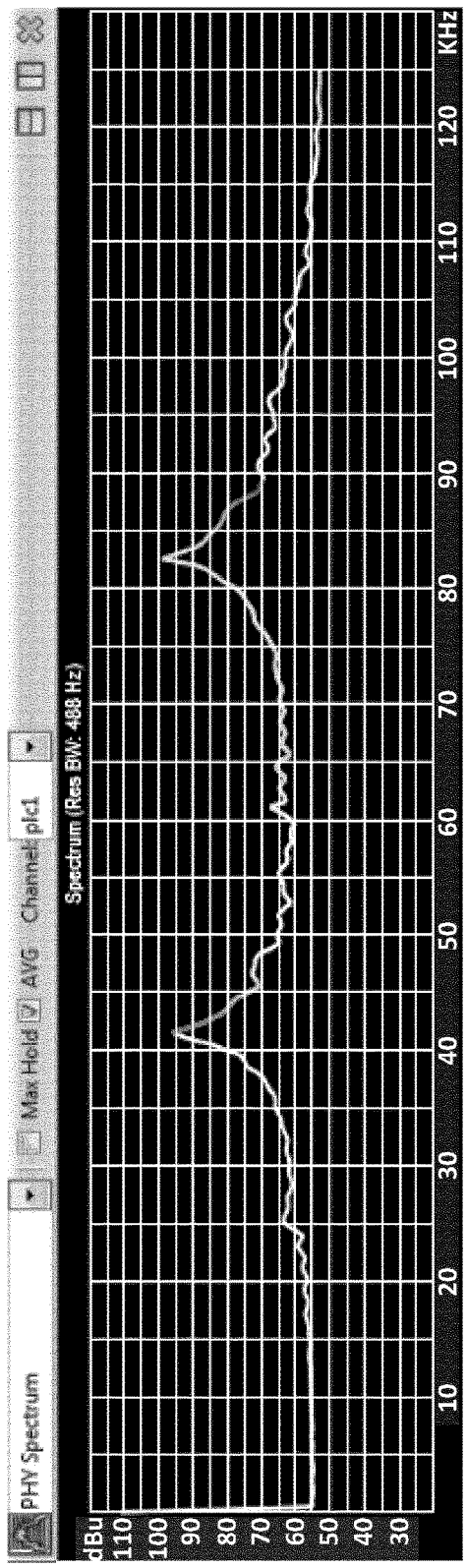
FIG. 8 shows an example of frequency spectrum measured between points A and B of the element behaving as a resistive element within the frequency band of the PLC communications. This spectrum is measured at a meter affected by noise (high noise).

When the electrical network is disturbed with high noises, the spectrum analysis measured at element 30, 40 between points A and B (FIGS. 3 and 4) may be similar to the spectrum shown in FIG. 8. In the context of the present disclosure, "high noise" means noise that affects the performance of the communications, while "low noise" means noise that does not affect the performance of the communications. Noise cannot usually be quantified in absolute values, because both noise power and communications power may vary. Besides, a same absolute value of noise may be considered to be high or low, that is to say, to affect or not the performance of communication, depending on the technology used. For example, if a one-carrier PLC technology is used, a peak of noise of −10 dBr (relative to the PLC carrier) in the carrier frequency is considered as perturbing (high noise), while a peak of noise of −60 dBr (relative to the PLC carrier) is not considered as perturbing (low noise). On the other hand, if multicarrier PLC technology is used, a peak of noise of −10 dBr (relative to the maximum PLC carrier) centered only in one frequency, may not disturb (and therefore may not be considered "high noise"), unless the communications performance worsens due to the effect of the disturbing signal (in which case, such peak is considered as disturbing (high noise). Other white noises (homogeneous in a frequency band) or pulse noises (short in time but high in level) are examples of disturbing noises in electrical networks.

Figure 9:
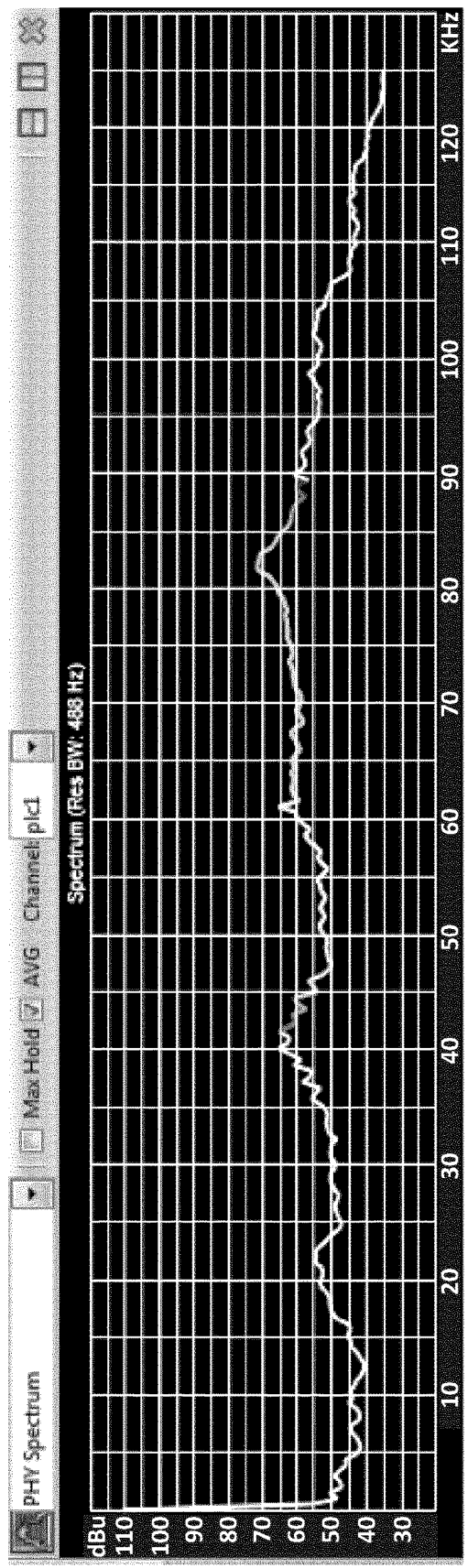
FIG. 9 shows an example of frequency spectrum measured between points A and B of the element behaving as a resistive element within the frequency band of the PLC communications. This spectrum is measured at a meter not affected by noise (low noise).

FIG. 8 represents a particular example of frequency spectrum of multicarrier PLC technology working within the frequency band of 42-88 kHz. It is remarked that other technologies may work at different frequencies or frequency bands. For example, a one-carrier PLC technology may work at a single frequency (for example, at 86 kHz). As can be observed in FIG. 8, the frequency spectrum between points A and B shows two peaks, representing the noise affecting the meter. Noise is typically expressed as peaks in the spectral response, although noise may alternatively be expressed in the spectral response in a different way from such peaks. The frequency spectrum shown in FIG. 8 may also be referred to as "noise spectrum". When, on the contrary, the electrical network is disturbed with low noises, the spectrum analysis measured on an impedance 30, 40 may be similar to the spectrum shown in FIG. 9. In FIG. 9, the PLC carrier also works at a frequency band between 42-88 kHz. As can be observed, no peaks representing noise between points A and B are present in the spectrum. This means that the PLC signal is not substantially affected by the noise. As already explained, noise can only be measured between two points A, B that have an impedance between them.

In particular embodiments, element 30 is selected/designed to have very low attenuation requirements (impedance absolute value<1mΩ) at the frequency (DC and 50-60 Hz) of the power supply, but not so low attenuation (impedance absolute value>1mΩ) for the PLC frequency bands. This means that, at the frequency (usually DC and 50 or 60 Hz although other frequencies may be used instead) of the power supply, the voltage drop between points A and B in FIGS. 3 and 4 must be close to zero but at the frequency or frequency bands of the PLC, a voltage drop can be measured (because it is different from zero) between points A and B in FIGS. 3 and 4. When the electrical network is disturbed with high noises, the spectrum analysis measured on element 30 is similar to the spectrum shown in FIG. 8.

Turning back to a distributing network, in which noise is causing disturbance in one smart meter (but that noise is replicated in many meters within the distributing network), the level of the noise spectrum shown in FIG. 8 is higher in the meter connected directly to the source of the noise than in the rest of meters in the same area but not connected to the source of the noise (even if some of those meters are adjacent the meter directly affected by the noise). In a non-limiting example, noise power may be 20 dB higher in the meter directly connected to the source of noise than in an adjacent meter. Thus, it is possible to unequivocally and easily identify where the problem (noise source) is. As a consequence, a decision can be taken in order to prevent the communication fall. In a particular embodiment, the fall in the communication is prevented by installing an electrical filter between the smart meter and the noise source.

Next, three possible embodiments of the disclosure are disclosed. They represent three different ways of implementing the method for measuring/detecting noise in the electric network.

Figure 5:
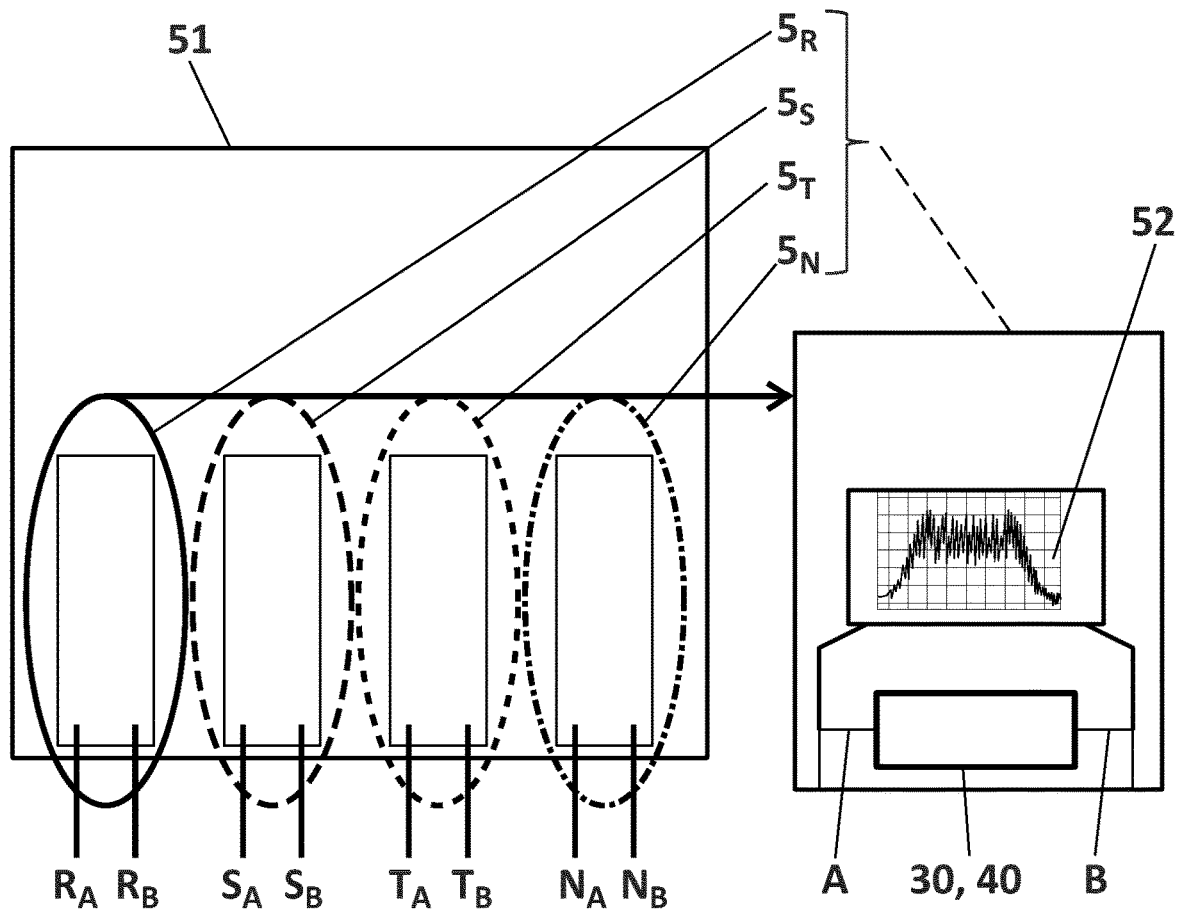
FIG. 5 shows a scheme for detecting the source of noise in a smart meter, according to a possible embodiment of the disclosure.

In a particular embodiment, an internal circuit is implemented within the meter 51. In this first embodiment, noise is measured/detected from the smart meter itself, thanks to an internal circuit for noise detection $5_R$ $5_S$ $5_T$ $5_N$ disposed therein. This is illustrated in FIG. 5. Internal circuits $5_R$ $5_S$ $5_T$ $5_N$ within the meter 51 measure the electrical noise between points A and B (of any of the three phases R, S, T and optionally in the neutral cable) in the PLC frequency bands. As shown in FIG. 5, the own meter 51 is measuring the spectrum by means of an internal configuration comprising a analyzer 52 for measuring the spectral response at the frequency of the PLC network between points A and B (same points as illustrated in FIGS. 3 and 4). Other external elements are not needed in this embodiment. The measurement is controlled and implemented within the meter 51. The result of the measurement made thanks to the circuit $5_R$ $5_S$ $5_T$ $5_N$ can be either shown on a display comprised in the meter (for example to be seen by a technician supervising the meter) or can be registered in an internal memory of the meter, or both. This solution may be of interest to be implemented on new meters to be developed. In non-shown meters having one single phase (R), there is only one internal circuit $5_R$ (and optionally one $5_N$ in the neutral cable). In non-shown meters having two phases (R, S), there are two internal circuits, one per phase $5_R$ $5_S$ (and optionally one $5_N$ in the neutral cable).

Figure 6:
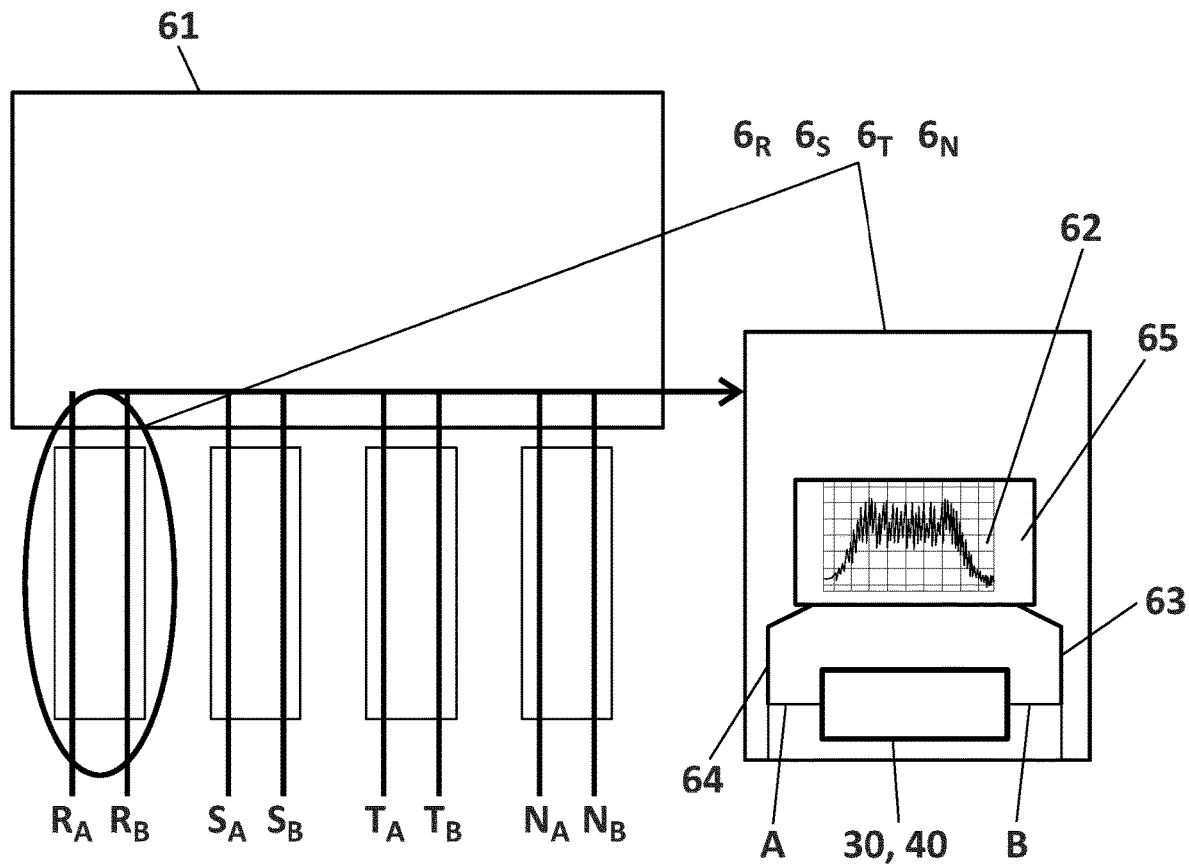
FIG. 6 shows a scheme for detecting the source of noise with a noise detection element, externally to the meter, according to an alternative embodiment of the disclosure.

In an alternative embodiment, a device $6_R$ $6_S$ $6_T$ $6_N$ external to the meter 61 is implemented. In non-shown meters having one single phase (R), there is only one external device $6_R$ (and optionally one $6_N$ in the neutral cable). In non-shown meters having two phases (R, S), there are two external devices, one per phase $6_R$ $6_S$ (and optionally one $6_N$ in the neutral cable). Therefore, noise is measured/detected externally to the smart meter 61. This is illustrated in FIG. 6. The external device $6_R$ $6_S$ $6_T$ $6_N$ (one per phase cable and optionally an additional one for the neutral cable) measures the spectrum in the frequency band of interest, accessing to the points A and B (or other points connected to them in the bus bars). Element 30, 40 is located within the smart meter 61. In order to perform such measurement, the external device comprises an analyzer 62 for measuring the spectral response between points A and B. Points A and B can be accessed from the external part of the smart meter 61. In order not to suffer from other disturbances, shielded cables 63 64 and an isolated probe 65 are necessary between the points A and B and the device $6_R$ $6_S$ $6_T$ $6_N$ used for the measurement. This shielded cables 63 64 and probe 65 are comprised within the external device $6_R$ $6_S$ $6_T$ $6_N$. This embodiment allows to perform the measurement in points of other meters in the same area, different from points within the smart meter 61, electrically connected to points A and B (see FIGS. 3 and 4), if losses in cables (or other connecting elements) are low enough to measure the same signal level as the signal level that would be measured at points within the smart meter 61. It is remarked that an absolute value of loss in a cable or connecting element can be considered to be high or low, depending on the PLC signal level and on the noise level. In particular, non-limiting example, in which the measured noise level is 15 dB over the background noise, measurements can be performed in other meters if the loss in the connecting element is lower than 5 dB at those frequencies. As mentioned, the external device $6_R$ $6_S$ $6_T$ $6_N$ comprises a spectrum analyzer 62, shielded cables 63 64 and an isolation probe 65. The measurement is taken with a spectrum analyzer 62 adapted/tuned to the PLC frequency bands. This solution may be of interest for companies that have already installed a significant amount of meters, as it does not require modifying the architecture or design of the meter.

Figure 7:
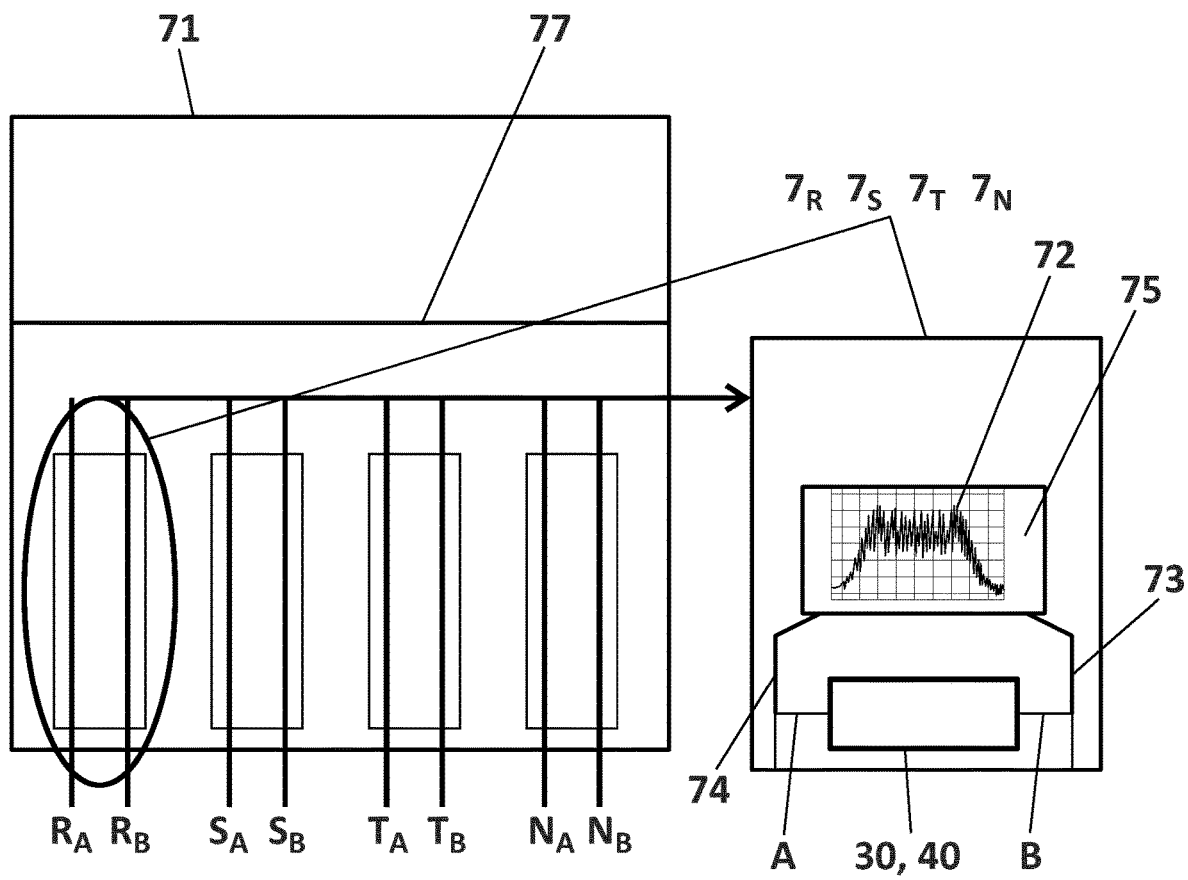
FIG. 7 shows a scheme for detecting the source of noise in a smart meter, using the cover of the cables to integrate the noise detection element, according to an alternative embodiment of the disclosure.

In a still alternative embodiment, a special terminal cover 77 is used. Usually, meters 71 have a terminal cover to protect users from possible electrical damages. In this embodiment, the terminal cover 77 with which smart meter 71 is covered, is configured to be used for the detection of the noise sources. This is illustrated in FIG. 7. The terminal cover 77 can be used with already installed meters, without requiring modifying their architecture or design. This cover 77 includes a measuring device $7_R$ $7_S$ $7_T$ $7_N$ incorporated therein. The measuring device $7_R$ $7_S$ $7_T$ $7_N$ comprised in the terminal cover 77 is connected to points A and B (see FIGS. 3 and 4). The measurements are performed in a similar way as described with respect to the embodiment in FIG. 6, that is to say, by means of a measuring device comprising a spectrum analyzer 72, shielded cables 73 74 and an isolation probe 75. This solution may be applied both to new meters and for already installed meters. Again, in non-shown meters having one single phase (R), there is only one measuring device $7_R$ (and optionally one $7_N$ in the neutral cable). In non-shown meters having two phases (R, S), there are two measuring devices, one per phase $7_R$ $7_S$ (and optionally one $7_N$ in the neutral cable).

In conclusion, the proposed method and systems permit to measure noise causing disturbances in an electrical network and to detect which precise meter (or end user network to which that meter is connected) is causing such disturbance. The measurement is done at two points of the network having same voltage at the frequency of the electrical network power supply (usually DC and 50 or 60 Hz although other frequencies may be used instead) but having different voltage at the PLC frequencies. Thanks to the proposed method, there is no need to switch off a plurality of smart meters which, in spite of being working properly (they do not have an installation causing noise connected thereto) are affected by noise generated in an installation connected to another smart meter within a certain area. On the contrary, the method permits to isolate, without switching off many meters one by one, the smart meter having a disturbing installation connected thereto. Thus, other users are not annoyed and time and therefore money are saved to electric power providers.

On the other hand, the disclosure is obviously not limited to the specific embodiment(s) described herein, but also encompasses any variations that may be considered by any person skilled in the art (for example, as regards the choice of materials, dimensions, components, configuration, etc.), within the general scope of the disclosure as defined in the claims.

The invention claimed is:

1. A method for detecting a source of noise in an electrical grid distributing network implementing Power Line Communications, (PLC), said electrical grid distributing network comprising a plurality of meters respectively connected to a plurality of end-user networks, wherein said source of noise to be detected is originated in a device belonging to one of said end-user networks, wherein each of said meters is connected to at least one pair of cables corresponding to at least one phase of the 3 phases of the electrical grid, said at least one pair of cables comprising a first cable belonging to said distributing network and a second cable belonging to a corresponding end-user network, the method comprising:

at each of said meters, disposing an element behaving as a resistive element within the frequency band of the PLC, and behaving as a nonresistive element at the frequency of the electrical grid, between said first cable belonging to the distributing network and said second cable belonging to the end-user network;

measuring the difference in electric potential between the two ends (A, B) of each element disposed between said first cable belonging to the distributing network and said second cable belonging to the end-user network at the frequency band of the PLC; and from a spectral response within the frequency band of the PLC obtained from said at least one measurement, determining whether a device belonging to the end-user network and connected to said meter is causing a noise disturbance.

2. The method of claim 1, further comprising:

at each of said meters, disposing another element behaving as a resistive element within the frequency band of the PLC, and behaving as a nonresistive element at the frequency of the electrical grid, between the neutral cable belonging to the distributing network and the neutral cable belonging to the end-user network;

measuring the difference in electric potential between the two ends of said element;

from a spectral response within the frequency band of the PLC obtained from said measurement, determining whether a device belonging to the end-user network and connected to said meter is causing a noise disturbance or not.

3. The method of claim 1, wherein said element is a switch.

4. The method of claim 1, wherein said element is a cable, a splice, a resistor and a fuse, or any element behaving as a resistive element within the frequency band of the PLC, and behaving as a nonresistive element at the frequency of the electrical grid.

5. The method of claim 1, wherein said at least one measurement in the difference in electric potential between the two ends of said element is performed within said meter.

6. The method of claim 5, wherein said at least one measurement is performed within said meter by means of a spectrum analyzer disposed within the meter and configured to measure the spectral response at the frequency of the PLC network between the two ends of said element.

7. The method of claim 1, wherein said at least one measurement in the difference in electric potential between the two ends of said element is performed at a measuring device outside said meter.

8. The method of claim 7, wherein said at least one measurement is performed by means of a measuring device external to said meter, said measuring device comprising a spectrum analyzer configured to measure the spectral response at the frequency of the PLC network between the two ends of said element, shielded cables and an isolation probe.

9. The method of claim 8, wherein said measuring device is comprised within a terminal cover configured to cover said meter.

10. A system for detecting a source of noise in an electrical grid distributing network implementing Power Line Communications, (PLC), said electrical grid comprising a plurality of meters respectively connected to a plurality of end-user networks, wherein said source of noise to be detected is originated in a device belonging to one of said end-user networks, wherein each of said meters is connected to at least one pair of cables corresponding to at least one phase of the 3 phases of the electrical grid, said at least one pair of cables comprising a first cable belonging to said distributing network and a second cable belonging to a corresponding end-user network, the system comprising: the system being characterized in that each of said meters comprises an element behaving as a resistive element within the frequency band of the PLC, and behaving as a nonresistive element at the frequency of the electrical grid, said element being disposed between said first cable belonging to the distributing network and said second cable belonging to the end-user network; and the system comprising means for measuring, at each meter, the difference in electric potential between the two ends (A, B) of each element disposed between said first cable belonging to the distributing network and said second cable belonging to the end-user network at the frequency band of the PLC; and for determining, from a spectral response within the frequency band of the PLC obtained from said at least one measurement, whether a device belonging to the end-user network and connected to said meter is causing a noise disturbance.

11. The system of claim 10, wherein said means for measuring comprises a spectrum analyzer configured to measure the spectral response at the frequency of the PLC network between the two ends of said element.

12. The system of claim 10, wherein said means for measuring is comprised within said meter.

13. The system of claim 10, wherein said means for measuring is external to said meter.

14. The system of claim 13, wherein said means for measuring further comprises shielded cables and an isolation probe.

15. The system of claim 13, wherein said means for measuring is comprised within a terminal cover configured to cover said meter.

* * * * *